United States Patent [19]

Watanabe

[11] Patent Number: 5,167,031
[45] Date of Patent: Nov. 24, 1992

[54] VARIABLE FREQUENCY CLOCK PULSE GENERATOR FOR MICROCOMPUTER

[75] Inventor: Nobuhisa Watanabe, Kanagawa, Japan

[73] Assignee: Sony Corporation, Japan

[21] Appl. No.: 192,363

[22] Filed: May 10, 1988

[30] Foreign Application Priority Data

May 14, 1987 [JP] Japan .............................. 62-117508

[51] Int. Cl.$^5$ .......................... G06F 1/06; G06F 1/08; G06F 1/32

[52] U.S. Cl. .............................. 395/550; 364/DIG. 1; 364/232.8; 364/270; 364/270.1; 364/270.3; 364/273.1; 307/265; 307/269; 307/271; 307/479; 307/480; 328/63; 328/72; 377/47; 377/48; 377/118

[58] Field of Search ... 364/200 MS File, 900 MS File; 307/269, 265, 271, 479, 480; 377/39, 47, 48, 118; 328/63, 72; 395/550

[56] References Cited

U.S. PATENT DOCUMENTS

| | | | |
|---|---|---|---|
| 3,941,989 | 3/1976 | McLaughlin et al. | 307/480 |
| 4,059,842 | 11/1977 | Meacham | 328/63 |
| 4,229,699 | 10/1980 | Frissell | 328/63 |
| 4,365,203 | 12/1982 | DiMassimo et al. | 328/63 |
| 4,423,383 | 12/1983 | Svendsen | 328/63 |
| 4,463,440 | 7/1984 | Nishiura et al. | 364/900 |
| 4,584,698 | 4/1986 | Sibigtroth et al. | 307/271 |
| 4,615,005 | 9/1986 | Maejima et al. | 364/200 |
| 4,686,386 | 8/1987 | Tadao | 307/269 |
| 4,748,417 | 5/1988 | Spengler | 328/72 |
| 4,819,164 | 4/1989 | Branson | 364/200 |
| 4,821,229 | 4/1989 | Jauregui | 364/900 |
| 4,855,615 | 8/1989 | Humpleman | 307/480 |
| 4,893,271 | 1/1990 | Davis et al. | 364/900 |
| 4,947,411 | 8/1990 | Shiraishi et al. | 377/47 |
| 5,086,387 | 2/1992 | Arroyo et al. | 395/550 |

FOREIGN PATENT DOCUMENTS

| | | |
|---|---|---|
| 0190554 | 8/1986 | European Pat. Off. . |
| 0242010 | 10/1987 | European Pat. Off. . |
| 60-19222 | 1/1985 | Japan . |
| 60-263523 | 12/1985 | Japan . |

OTHER PUBLICATIONS

Patent Abstracts of Japan, vol. 10, No. 133 of May 17, 1986.
Patent Abstracts of Japan, vol. 9, No. 137 of Jun. 12, 1985.
New Electronics, vol. 17, No. 14, 10th Jul. 1984, pp. 29, 31-32.
*Motorola CMOS Integrated Circuits*, 1978, pp. 7-17-5-7-182, 7-426-7-431, and 7-483-7-489.

Primary Examiner—David L. Clark
Assistant Examiner—Matthew C. Fagan
Attorney, Agent, or Firm—Ronald P. Kananen

[57] ABSTRACT

A clock pulse generator for a one-chip microprocessor permits the microprocessor to be operated on two different power sources by effectively using a single source of clock pulses, a clock pulse divider and gate circuits to gate a specific sequence of pulses to the microprocessor. The period of a slowest clock pulse signal after division is integrally related to the periods of the faster clock pulse signals so that the pulse signals are synchronously provided.

3 Claims, 2 Drawing Sheets

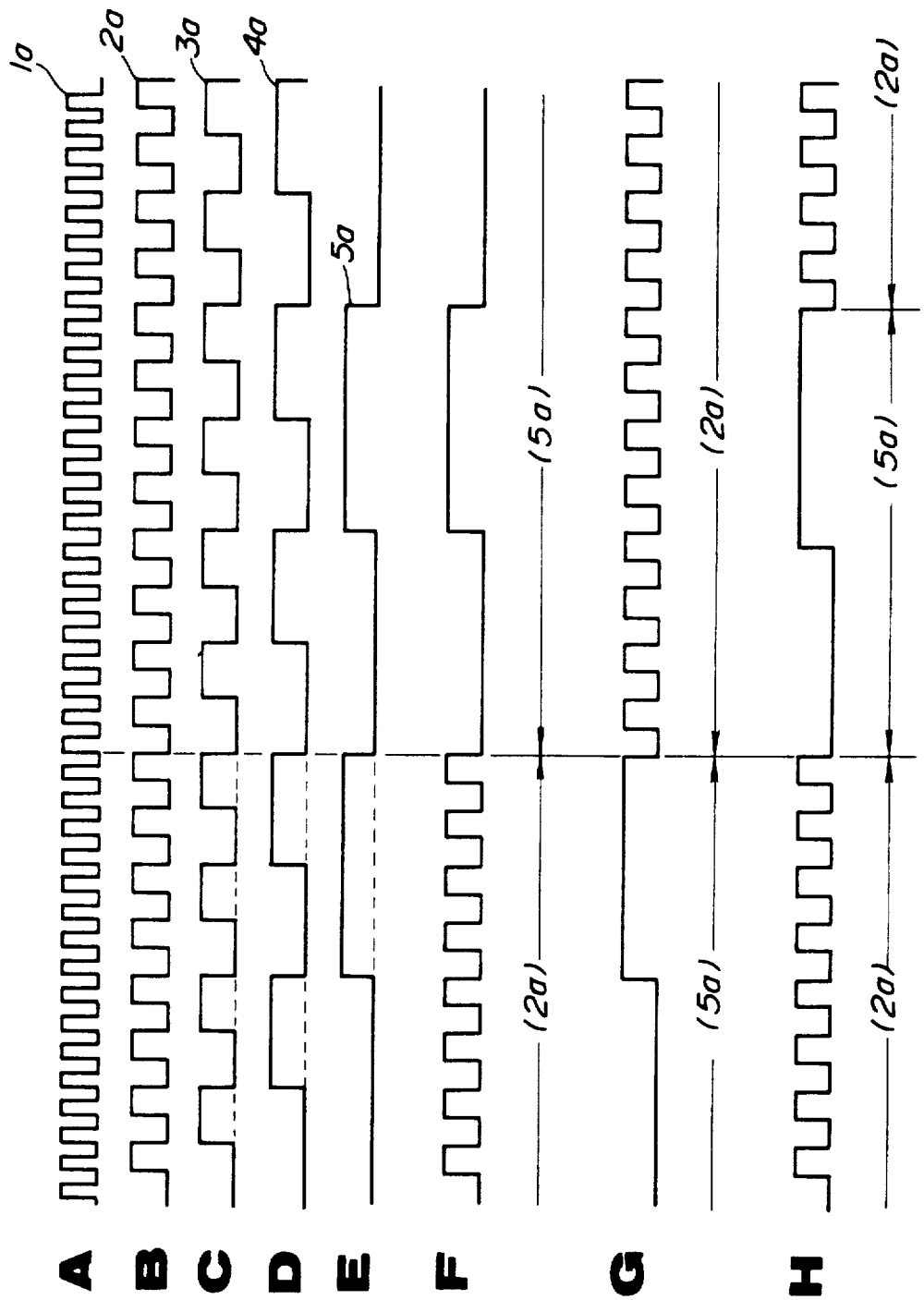

VARIABLE FREQUENCY CLOCK PULSE GENERATOR FOR MICROCOMPUTER

FIELD OF THE INVENTION

The present invention relates generally to a clock pulse generator for a microcomputer, and more specifically to an improved arrangement for use with one-chip type microcomputers.

BACKGROUND OF THE INVENTION

Normally silicon chip microprocessors including a central processing unit CPU, a read only memory ROM, a random access memory RAM and an output-input interface I/O are formed on a single chip (one-chip microcomputer) and are arranged to operate on a 5 V power supply. However, recently a demand for a one-chip microprocessor which can be operated on batteries has developed. This requires that the supply on which the device is to be operated can be selectively reduced from 5 V to 3 V. This reduction induces a change in the generation of clock pulses which are used in connection with the operation of the CPU. When this change occurs however, improper operation is apt to occur.

Accordingly, it is required to be able to produce low speed clock pulses when this reduction in power occurs in a manner which renders it possible to maintain proper operation. It is additionally required to be able to provide low speed clock signals, when the power supply is reduced for the purpose of conserving electrical power, and/or in the event of a power blackout.

Moreover, it is desirable to be able to expand control over the reading and writing cycles when accessing an external low speed expansion memory.

In order to achieve the above it has been proposed to use two clock pulse generators—one for high speed pulse signals and one for low speed pulse signals. However, this arrangement is such that when one is in use the other is rendered redundant. Further, when switching from one to another, it often occurs that an asynchronism or misalignment occurs in the relationship between the pulses.

SUMMARY OF THE INVENTION

It is an object of the present invention to provide a clock pulse generator which features simple construction and cost, and which enables switching between high and low speed pulses without undesirable interruption of CPU activity.

In brief, the above object is achieved by an arrangement wherein in order to permit a one-chip type microprocessor to be operated on two different power sources such as a household supply and batteries and in order to facilitate slow speed external memory access, the output of a single source of pulses is sequentially frequency divided a plurality of times and gate circuits are arranged so that the output of any on of the plurality of division stages can be selectively supplied to an output terminal of the device.

More specifically, a first aspect of the present invention is that a one-chip microprocessor clock pulse generator features: a source of clock pulses; means for successively dividing the clock pulses by the same factor for producing a corresponding plurality of clock pulse signals the pulse widths of which are different; and a plurality of gate circuits, each of the gate circuits being arranged to selectively supply a respective one of the clock pulse signals to an output terminal arrangement.

A second aspect of the invention is that the dividing means comprises a plurality of frequency dividers, the frequency dividers being connected in a manner wherein a first one of the frequency dividers is arranged to divide the pulses supplied from the source in a predetermined manner, and the next frequency divider is arranged to receive the output of the first frequency divider and perform essentially the same division.

A further aspect of the invention is that the above-mentioned plurality of clock pulse signals are divided in a manner that one of the leading and trailing edges of corresponding pulses from each pair of clock pulse signals occur coincidently thus enabling switching from one clock pulse signal to another without any phase difference occuring.

Another aspect of the invention involves a method of generating clock pulses in a microprocessor, featuring the steps of: using a single source to produce a basic clock pulse signal; successively dividing the basic clock pulse signal to form a series of clock pulse signals, each having successively longer pulse widths; and selectively using one of the series of clock pulse signals in connection with the control of the processor.

A yet further aspect of the invention involving the above-mentioned method features arranging one of the leading and trailing edges of corresponding pulses from different pairs of the clock pulse to cyclically occur synchronously.

BRIEF DESCRIPTION OF THE DRAWINGS

The features and advantages inherent with the present invention are more clearly seen from the following description of the preferred embodiment with reference to the appended drawings, of which:

FIG. 2 is a timing chart which demonstrates the operational characteristics of the arrangement shown in FIG. 1.

DESCRIPTION OF THE PREFERRED EMBODIMENT

Figure 1:
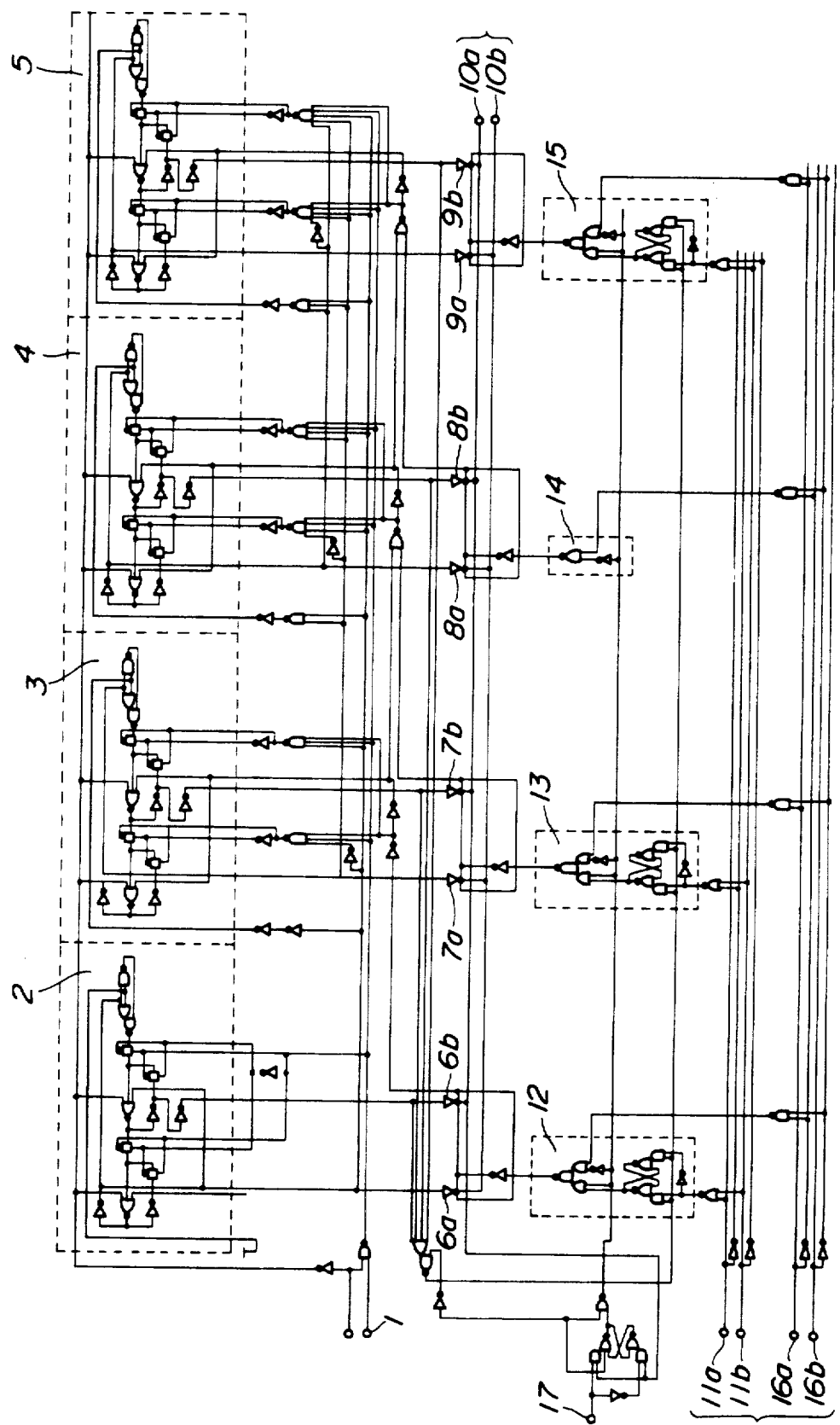
FIG. 1 is a circuit diagram showing the construction of an embodiment of a clock pulse generator according to the present invention.

FIG. 1 shows a circuit arrangement which characterizes the present invention. This arrangement includes: two input terminals 1 which are arranged to receive clock pulses 1a such as shown in FIG. 2A from a liquid crystal type clock pulse generator (not shown); frequency dividers 2-5; gate circuits 6a, 6b, 7a, 7b, 8a, 8b and 9a, 9b; clock pulse signal output terminals 10a, 10b; gate control signal generator circuits 12-15; designated signal input terminals 11a, 11b, 16a and 16b; and a discrimination signal input terminal 17 which is arranged to receive a signal from a memory address decoder, all connected as shown.

With this arrangement the first frequency divider 2 is arranged to perform a first division by 2 on the input pulses 1a of FIG. 2A, in a manner to produce a pulse train 2a such as shown in FIG. 2B. The second pulse divider 3 is arranged to perform a second division to produce a pulse train having a frequency ¼ of the original one, namely, to produce a signal 3a of the nature shown in FIG. 2C.

The third and fourth frequency dividers are arranged to perform subsequent frequency divisions and produce signals 4a and 5a (see FIGS. 2D, 2E) which respectively have frequencies which are ⅛ and 1/16 of the input signal 1a. As will be noted each of the clock pulses 2a to 5a are arranged to be cyclically formed with a phase difference with respect to clock pulses 1a that is 180° of the phase of clock pulses 1a ahead of (or, equivalently, behind) the clock pulses 1a at the beginning (or, equivalently, the end) of each cycle (as at the moment indicated by the vertical lines extending across the waveforms of FIGS. 2A to 2 H).

The outputs of the frequency dividers 2-5 are respectively supplied through the gate circuits 6a-9b to the clock signal output terminals 10a, 10b.

A two bit digital signal from the computer control circuit is supplied to the designated input terminals 11a, 11b. This signal functions to selectively control the gate circuits 6a-9b. Viz., when both of the signals appearing on the terminals 11a and 11, assume low levels (0, 0), the gate formed by the gate circuits 6a, 6b is switched to assume an ON condition, whereby the clock pulses 2a which have been divided by 2 once appear on the clock pulse output terminals 10a, 10b. When the levels on the terminals 11a and 11b assume low and high levels (0, 1) respectively, the gate formed by the gate circuits 7a, 7b is selectively conditioned to assume an ON state. Under these conditions clock pulse train 3a is supplied to the clock pulse output terminals 10a, 10b.

In the event that the signals appearing on terminals 11a and 11b assume high and low levels (1, 0), respectively, gate circuit 8a, 8b is opened and the clock pulses 4a are selectively applied to terminals 10a, 10b. Finally, if the signals appearing on the terminals 11a, 11b both assume high levels (1,1) then the last of the gates is conditioned to open and apply the four-times divided pulse train 5a to terminals 10a, 10b.

When a two bit signal from an external memory is applied to the terminals 16a and 16b, a similar control wherein the gate control circuits 12 to 15 selectively open the gates formed by the gate circuits 6a-9b is possible. In this case, namely that the external memory is selected in which case a discrimination signal is applied to terminal 17, the gate control circuits 12 to 15 are selectively conditionable to open the four gates formed by the gate circuits 6a to 9b.

When the above disclosed circuit arrangement is put into operation in a manner wherein the high speed clock pulses 2a are to be initially provided and then changed to those shown in FIG. 2E (viz., 5a), low level signals are first applied to both the terminals 11a and 11b. This induces gate control circuit 12 to apply a high level signal (1) and conditions the gate formed by the gate circuits 6a, 6b to assume an ON state. Under these conditions high speed pulses are applied to the output terminals 10a, 10b in the manner illustrated in FIG. 2F and are supplied to the CPU of the microprocessor.

Then the control circuit of the microprocessor applies high level signals (1, 1) to both of the terminals 11a and 11b, and the gate control circuit 15 is conditioned to apply a high level signal to turn ON the gate formed of the gate circuits 9a, 9b. This results in the pulses appearing on the clock pulse output terminals 10a, 10b to assume the form show in the latter half of FIG. 2F.

As both of these signals have been derived from the same basic signal 1a when the change occurs, and because the trailing edges of the two signals are aligned at the moment of switching, no shift in signal timing can occur and disturb the operation of the microprocessor.

In the case that the reverse change is induced and low speed clock pulses are changed to high speed ones, the levels of the signals applied to terminals 11a and 11b are switched from (1, 1) to (0, 0). At this time the gate formed of gate circuits 9a, 9b is rendered non-conductive while the gate formed of gate circuits 6a, 6b is opened. The results of this is shown in FIG. 2G. As can be seen, since the CPU is responsive to the clock pulses the above mentioned switching will be timed in accordance with the currently supplied pulse train and thus, in this instance, will wait for a trailing edge of the low speed pulses before inducing the signal level change which will induce the supply of high speed pulses. As before, since the trailing edges of pulses 2a and 5a are inherently aligned at the end of every cycle of the slow speed clock pulses 5a, upon the change the phasing of the two signals are perfectly matched, ensuring error free CPU operation.

In the case that a low speed external memory access cycle is to be induced, a high level signal is applied from a memory address decoder (not shown) to terminal 17. Prior to this time the program being run in the CPU is controlled in a normal mode in accordance with the high speed pulses 2a. However, upon the application of a high level signal to terminal 17, the gate formed of gate circuits 6a, 6b is closed and the gate formed of gate circuits 9a, 9b is rendered conductive. Under these circumstances the clock pulses supplied change in the manner illustrated in FIG. 2H and low speed clock pulses are then fed to the CPU. The high level signal applied to terminal 17 is maintained for 1 memory cycle and is then automatically switched to low level. This switching of course permits the resumption of the supply of high speed clock pulses to the CPU to permit appropriate processing.

In accordance with the above disclosed arrangement it is possible to selectively supply four different clock pulses simply by changing a two bit signal. Accordingly, when the device is required to be operated in an energy conservation mode, such as on a low voltage source such as torch batteries or the like, it is possible to select any of the waveforms ranging from the 2a clock pulses to the 5a ones. It is also possible to switch to the low speed pulses in the event of a blackout without adverse effect on the operation of the processor. Further, the present invention permits low speed external memory access bus cycle control with the same simple hardware. Moreover, in the event that a system includes a high speed memory in addition to the above mentioned low speed type, the instant invention facilitates appropriate clock signal control without the need of additional circuitry and increases the system throughput.

It will be understood that the present invention is not limited to the illustrated arrangement and that various changes and modifications can be made without departing from the scope of the instant invention which is limited only to the appended claims.

What is claimed is:

1. A one-chip microprocessor having a clock pulse generator on the same chip comprising:
   means for receiving clock pulses;
   dividing means connected to said receiving means, for successively dividing said clock pulses a plurality of times and for producing a corresponding plurality of clock pulse signals having a slowest and a plurality of faster clock pulse signals, each of said plurality of clock pulse signals having leading and trailing edges and having different pulse widths, wherein one period of the slowest of said plurality of clock pulse signals is equal to a respective predetermined integer number of periods of each of the faster clock pulse signals, said one period and said periods of each of the faster clock pulse signals each defining a cycle, wherein for any pair of said clock pulse signals, a predetermined one of the leading and trailing edges of one of the pair of clock pulse signals having a longer period coincides with a predetermined one of the leading and trailing edges of the other clock pulse signal of the pair having a shorter period;

a plurality of gate circuits connected to said dividing means for selectively supplying only one of said clock pulse signals produced by said dividing means, at a time;

an output terminal arrangement connected to said plurality of gate circuits for outputting said one clock pulse signal to said microprocessor;

a first pair and second pair of input terminals connected to said plurality of gate circuits for selectively controlling said plurality of gate circuits in response to control signals supplied to said first pair or second pair of input terminals; and a third input terminal and control means connected to said first pair and second pair of input terminals for determining which of said first and second pairs of input terminals control said plurality of gate circuits.

2. The microprocessor of claim 1 wherein said dividing means comprises a plurality of frequency dividers, wherein a first one of said frequency dividers divides said clock pulses in a predetermined manner, and a next one of said frequency dividers, connected to said first frequency divider, receives an output of said first frequency divider and similarly divides the output of said first frequency divider as said first frequency divider divides said clock pulses.

3. The clock pulse generator of claim 1, wherein said clock pulses are divided only by 2, 4, 8 and 16 to produce said plurality of clock pulse signals.

* * * * *